United States Patent [19]

Koji

[11] Patent Number: 5,216,933

[45] Date of Patent: Jun. 8, 1993

[54] TOOL HOLDING MECHANISM FOR USE IN A BONDER

[75] Inventor: Sato Koji, Saitama, Japan

[73] Assignee: Kabushiki Kaisha Shinkawa, Tokyo, Japan

[21] Appl. No.: 621,267

[22] Filed: Dec. 3, 1990

[30] Foreign Application Priority Data

Dec. 2, 1989 [JP] Japan ................. 1-314073

[51] Int. Cl.$^5$ ........................................... G05G 11/00
[52] U.S. Cl. .................... 74/479 R; 29/834; 901/16
[58] Field of Search ............... 219/85.22, 85.16, 85.14, 219/85.15, 209; 228/49.1; 29/834; 74/479, 479, 479 R, 479 PF, 479 MF; 901/15, 16

[56] References Cited

U.S. PATENT DOCUMENTS

| | | | |
|---|---|---|---|
| 2,645,972 | 7/1953 | Aitcheson ................. | 74/479 X |
| 2,704,331 | 3/1955 | Stott et al. ................. | 74/479 X |
| 3,023,635 | 3/1962 | Ballmer ................. | 74/479 X |
| 3,691,864 | 9/1972 | Cochran et al. .................... | 74/479 |
| 4,317,560 | 3/1982 | Troyer ................. | 901/16 |
| 4,628,756 | 12/1986 | Kimura et al. ................. | 74/479 |
| 4,700,584 | 10/1987 | Narishige et al. .................... | 74/479 |
| 4,711,537 | 12/1987 | Schindl et al. .................... | 74/479 X |
| 4,712,444 | 12/1987 | Lewis ................. | 74/479 |

*Primary Examiner*—Leslie A. Braun
*Assistant Examiner*—David W. Laub
*Attorney, Agent, or Firm*—Koda and Androlia

[57] ABSTRACT

A tool holding mechanism used in a bonder including a vertically moving member, a Y-direction oscillating plate installed on the vertically moving member so that the plate is rotated and then tightly secured to the vertically moving member, an X-direction oscillating plate installed on the Y-direction oscillating plate so that the X-direction oscillating plate is rotated in a direction perpendicular to the rotational direction of the Y-direction oscillating plate and then secured to the Y-direction oscillating plate, a Y-direction adjuster which rotates the Y-direction oscillating plate, an X-direction adjuster which rotates the X-direction oscillating plate, a tool attachment fixed to the X-direction oscillating plate, a θ-direction adjustment holder rotatably supported by the tool attachment block, a bonding tool being attached to this holder, and an θ-direction adjuster which is installed on the tool attachment block and finely rotates the θ-direction adjustment holder about an axial center of the tool. Thus, the angle of the bonding tool can be easily and finely adjusted.

1 Claim, 8 Drawing Sheets

TOOL HOLDING MECHANISM FOR USE IN A BONDER

BACKGROUND OF THE INVENTION

1. Field of the Invention

The present invention relates to a tool holding mechanism for use in an assembly apparatus for semiconductor devices, such as an inner lead bonder, outer lead bonder, bump transfer bonder, pellet bonder, etc.

2. Prior Art

Tool holding mechanisms for use in bonders includes a tool holder to which a tool is fastened and an attachment section mounted to a tool-holding part of the bonder so that the tool holder is attached to the attachment section.

In bonders, it is desirable that the entire undersurface of the tool uniformly contact the bonding surface of the sample.

Mechanisms equipped with an automatic fit-adjusting means, such as those described in, for example, Japanese Patent Application Laid-Open (Kokai) No. 63-169730 and Japanese Patent Application Laid-Open (Kokai) No. 63-169731, are known as conventional tool holding mechanisms for use in bonders. In these mechanisms, the tool holder and attachment section are connected via a spring. Accordingly, when the tool is pressed against a sample, the undersurface of the tool fits against the bonding surface of the sample with the spring bent.

The mechanism in the prior art insures the flatness of the tool in the XY plane, and no consideration is given to adjustment in the direction of rotation about an axial center of the tool (i.e., the $\theta$-direction).

Figure 12:
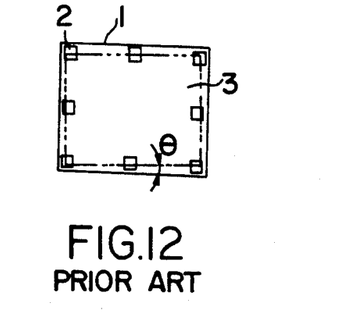
FIG. 12 is an explanatory plan view illustrating an adjustment of the discrepancy of the bonding tool in the θ-direction in prior art.

Conventionally, adjustment in the $\theta$-direction is accomplished in a following manner: As shown in FIG. 12, the tool is lowered so that a pressure mark of the tool is made on bumps 2 of a chip 1, and the discrepancy in the $\theta$-direction is examined. Then, the fastening screw of the tool is loosened to perform the adjustment by turning the tool directly by hand.

Thus, in the prior art, adjustment of the tool in the $\theta$-direction is accomplished by turning the tool directly by hand. Accordingly, application of the tool pressure marks and adjustment of the tool must be repeated several times, requiring considerable time and a high degree of skill.

Adjustment of the tool in the X and Y directions is accomplished by automatic fit adjustment. Accordingly, such adjustment requires no particular adjustment work. However, since the tool is pressed against the leads of the sample (which possesses elasticity) via a spring, slipping may occur at the time of the pressing. Because of such slipping, the tool is pressed against off-center portions of the leads instead of against the center of each lead. Consequently, the bonding precision and bondability are poor, causing faulty bonding.

SUMMARY OF THE INVENTION

Accordingly, a first object of the present invention is to provide a tool holding mechanism for use in a bonder which makes it possible to adjust the tool in the $\theta$-direction easily and in a short period of time.

A second object of the present invention is to provide a tool holding mechanism for use in a bonder which makes it possible to adjust the flatness of the tool in a short period of time and to prevent faulty bonding.

The first object of the present invention is achieved by a mechanism equipped with (a) a tool attachment block, (b) a $\theta$-direction adjustment holder which is rotatably held by the tool attachment block and to which a tool is fastened, and (c) a $\theta$-direction adjustment means installed on the tool attachment block and causes the $\theta$-direction adjustment holder to rotate little by little about the axial center of the tool.

The first and second objects of the present invention are both achieved by an addition of (a) a vertically moving member which is caused to move upward and downward, (b) a Y-direction oscillating plate installed on the vertically moving member so that the plate is rotatable but can be secured by a tightening means to the vertically moving member, (c) an X-direction oscillating plate installed on the Y-direction oscillating plate so that the X-direction oscillating plate is rotatable in a direction perpendicular to the rotational direction of the Y-direction oscillating plate but can be secured by a tightening means to the Y-direction oscillating plate, (d) a Y-direction adjustment means which rotates the Y-direction oscillating plate, and (e) an X-direction adjustment means which rotates the X-direction oscillating plate.

The action of the $\theta$-direction adjustment means is reduced (that is, the adjustment means is rotated finely or little by little) and transmitted to the $\theta$-direction adjustment holder, i.e. to the aforementioned tool, so that the tool rotates about its axial center. As a result, the discrepancy of the tool in the $\theta$ direction is corrected.

Since fine adjustment of the tool in the $\theta$ direction can be performed as described above, a quick, high-precision adjustment is possible.

When the X-direction oscillating plate is rotated by the X-direction adjustment means, the X-direction oscillating plate (to which the tool is fastened) rotates in the X direction. As a result, the inclination of the undersurface of the tool in the X direction is thus corrected.

When the Y-direction oscillating plate is rotated by the Y-direction adjustment means (with the X-direction oscillating plate fastened to the Y-direction oscillating plate), the Y-direction oscillating plate rotates in the Y direction, which is perpendicular to the direction or rotation of the X-direction oscillating plate (i.e., the X direction).

Since the X-direction oscillating plate is secured to the Y-direction oscillating plate, and since the tool is fastened to the X-direction oscillating plate, the inclination of the undersurface of the tool in the Y direction is corrected.

According to the present invention, since it is necessary merely to rotate the X-direction and Y-direction adjustment means, adjustments can be made quickly and with high precision. In addition, by positioning the centers of rotation of the X-direction oscillating plate and Y-direction oscillating plate at the tip of the tool, the position of the tool tip is not shifted.

DETAILED DESCRIPTION OF THE INVENTION

One embodiment of the present invention will be described with reference to the attached drawings.

The embodiment substantially includes (a) a vertical driving mechanism for tool 10, (b) a Y-direction adjustment mechanism, (c) an X-direction adjustment mechanism, and (d) a θ-direction adjustment mechanism. The X and Y directions are perpendicular to each other and define a plane to which the vertical direction is perpendicular.

Figure 1:
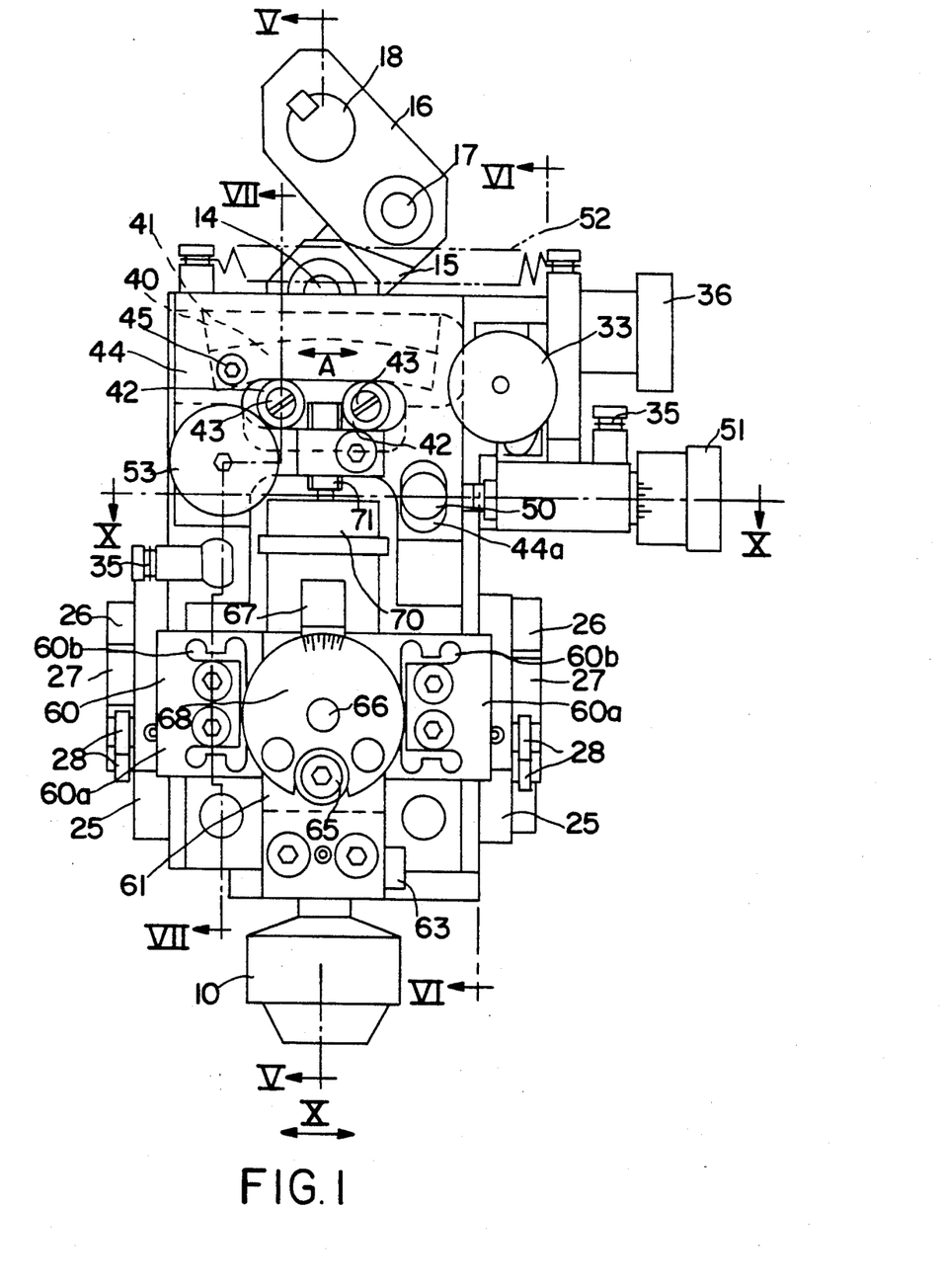
FIG. 1 illustrates a front view of one embodiment of the present invention.
Figure 2:
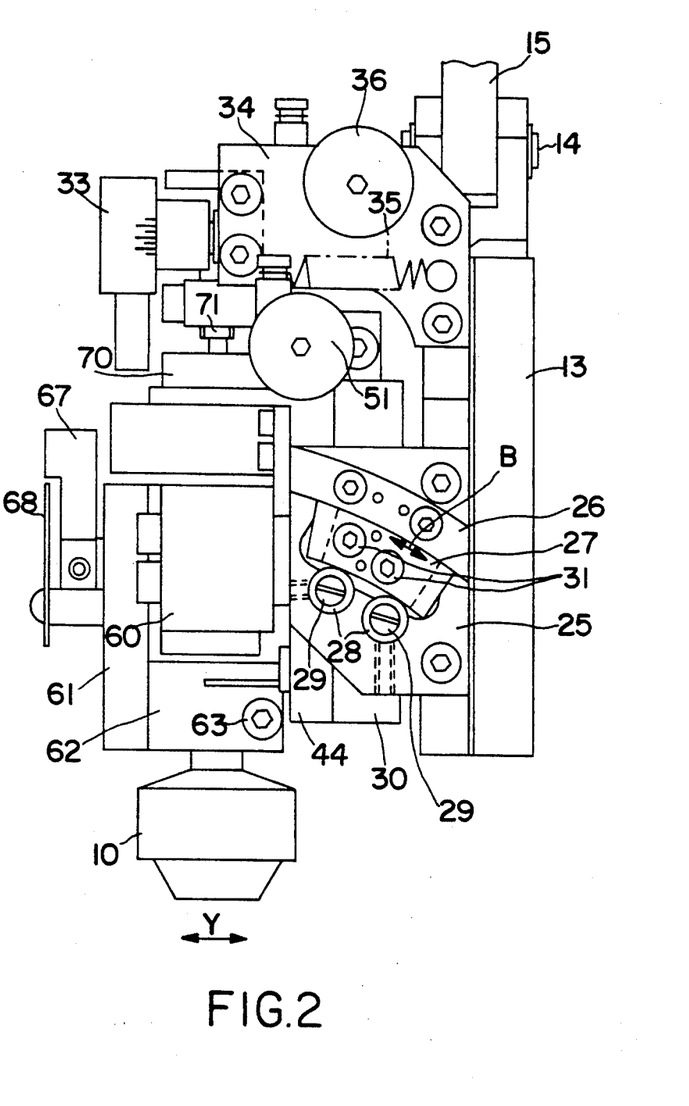
FIG. 2 is a right-side view thereof.
Figure 3:
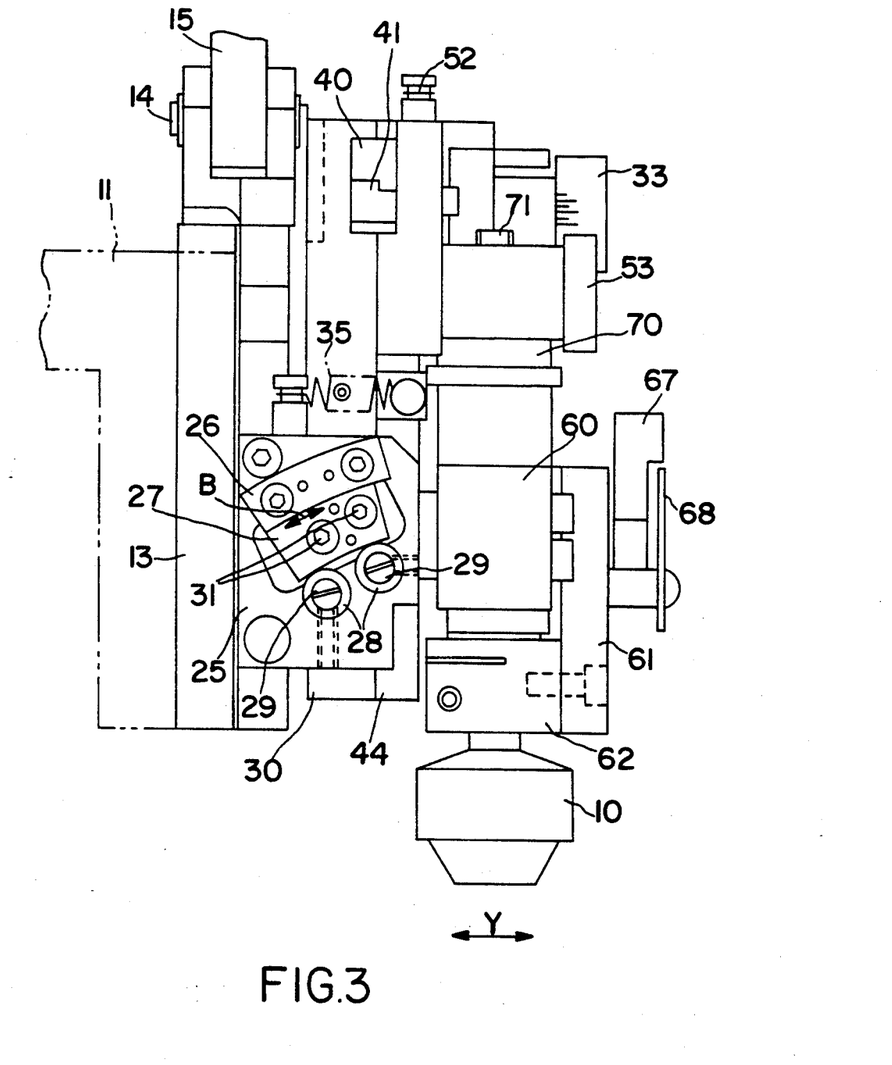
FIG. 3 is a left-side view thereof.
Figure 4:
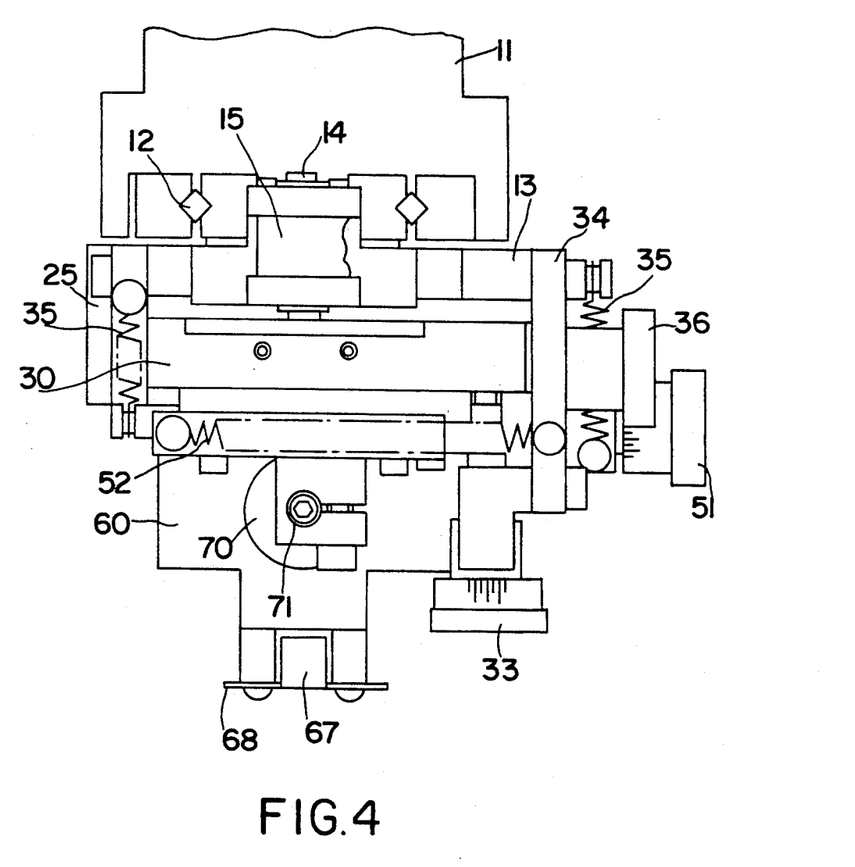
FIG. 4 is a top view thereof.
Figure 5:
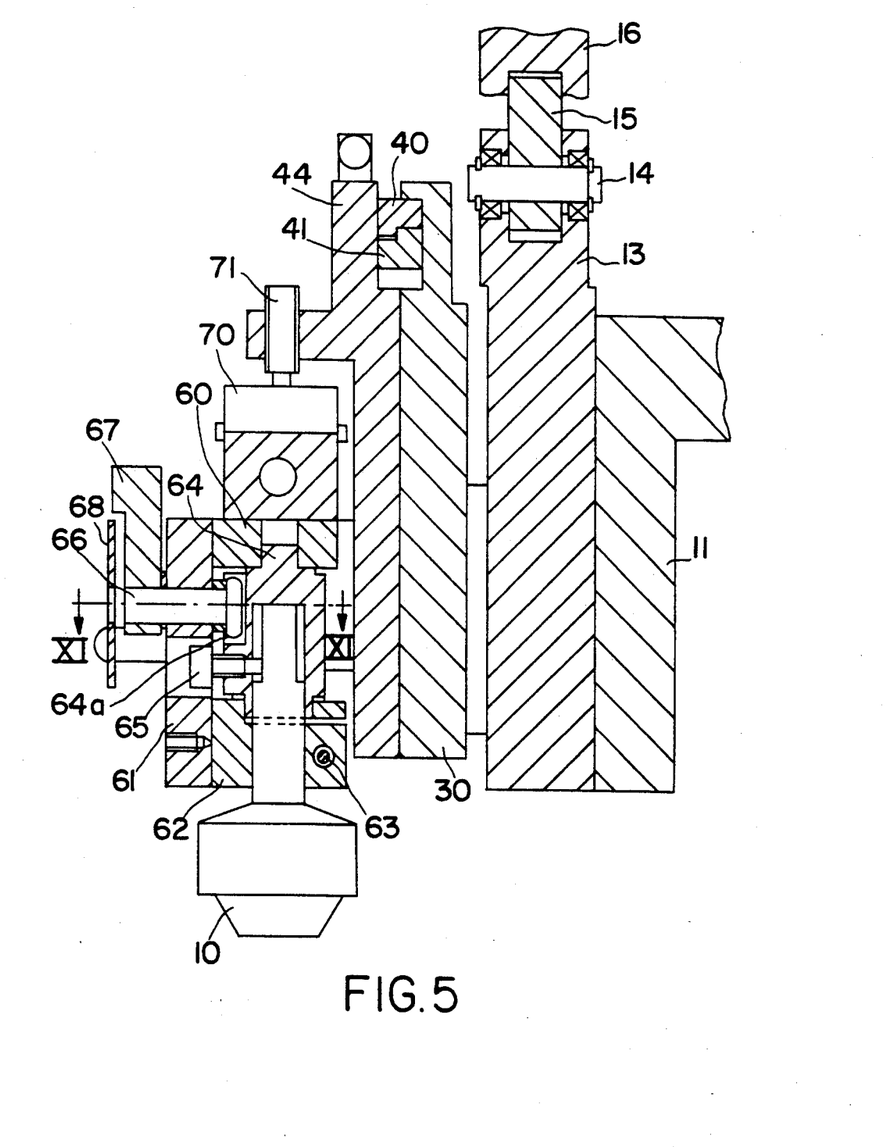
FIG. 5 is a cross sectional view taken along the line V—V in FIG. 1.
Figure 6:
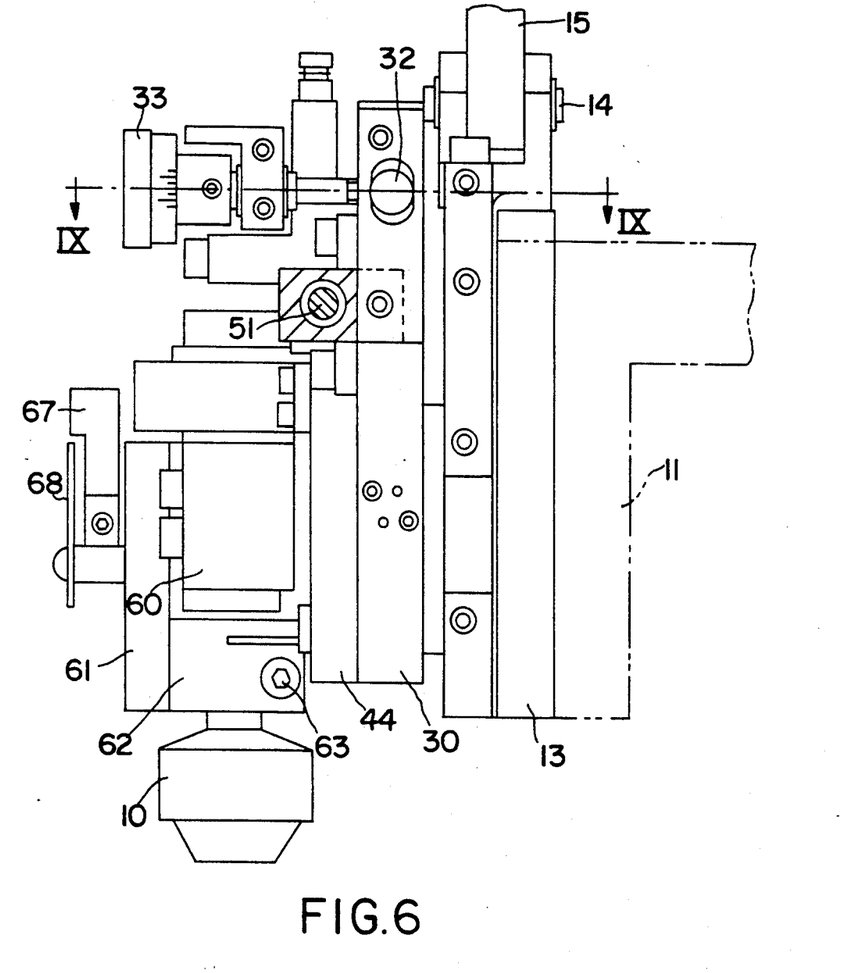
FIG. 6 is a cross sectional view taken along the line VI—VI in FIG. 1.
Figure 7:
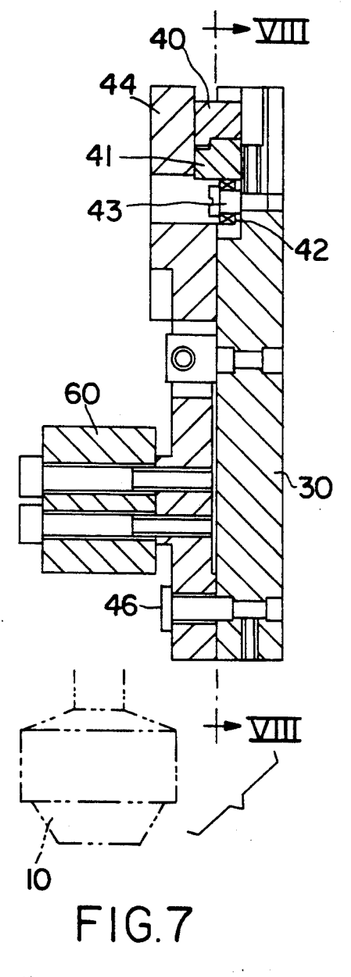
FIG. 7 is a cross sectional view taken along line the VII—VII in FIG. 1.
Figure 8:
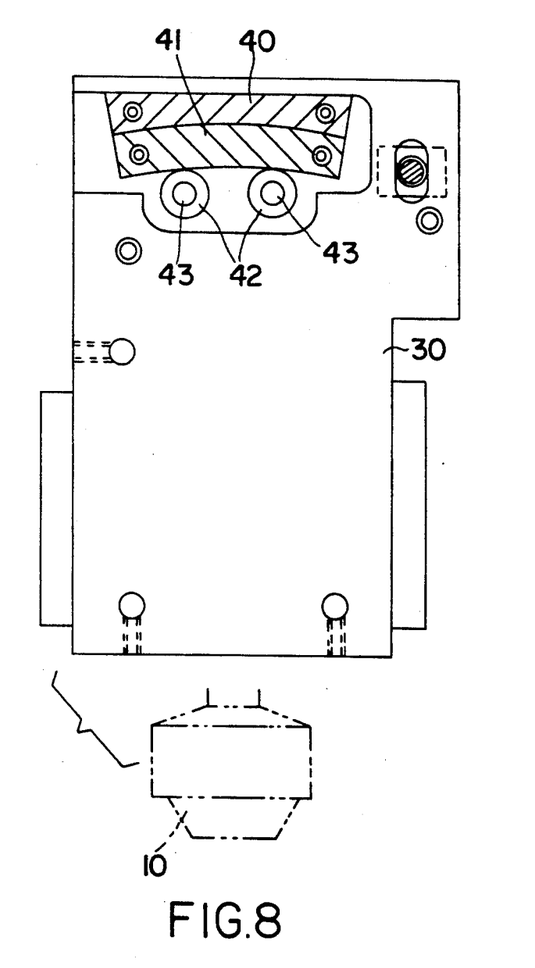
FIG. 8 is a cross sectional view taken along the line VIII—VIII in FIG. 7.
Figure 9:
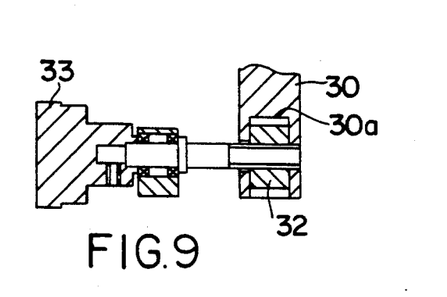
FIG. 9 is a cross sectional view taken along the line IX—IX in FIG. 6.
Figure 10:
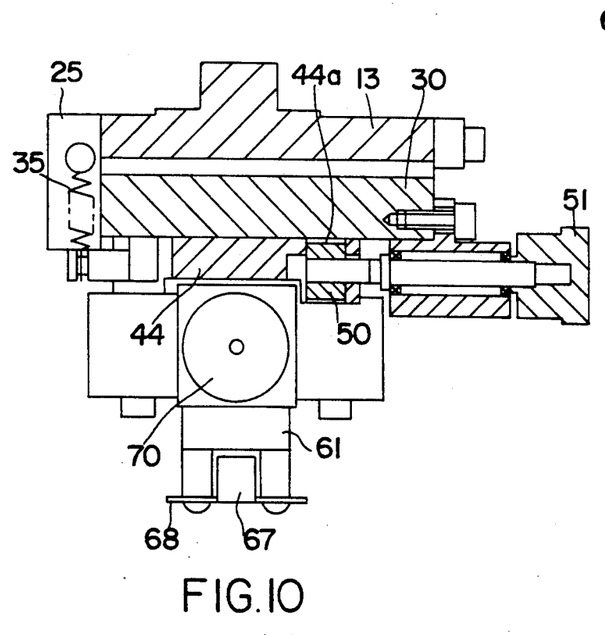
FIG. 10 is a cross sectional view taken along the line X—X in FIG. 1.
Figure 11:
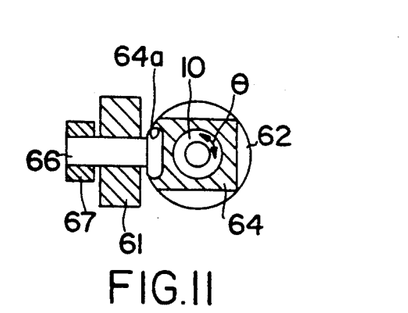
FIG. 11 is a cross sectional view taken along the line XI—XI in FIG. 5.

(a) Vertical Driving Mechanism (See FIGS. 1, 4 and 5).

A vertically moving plate 13 is installed on the tool holding part 11 of the bonder via bearings 12 so that the plate 13 is free to move upward and downward. A shaft 14 is supported on the upper end of the vertically moving plate 13 so that the shaft 14 is free to rotate, and one end of a lever 15 is fastened to the shaft 14. The other end of the lever 15 is fastened to a shaft 17 which is rotatably supported on one end of a lever 16. The other end of this lever 16 is connected to a drive shaft 18 which is driven by a motor (not shown). If the drive shaft 18 is caused to revolve, the vertically moving plate is caused to move up and down via the lever 16 and lever 15.

(b) Y-Direction Adjustment Mechanism (See FIGS. 2, 3, 4, 6, and 9).

Side plates 25 are fastened to both sides of the vertically moving plate 13, and a Y-direction guide plate 26 is fastened to each side plate 25. An X-direction guide plate 27 is fastened to each side plate 25. An X-direction sliding plate 27 is installed on the undersurface of each Y-direction guide plate 26, and each of these X-direction sliding plates 27 is supported by rollers 28. The rollers 28 are rotatably supported on eccentric shafts 29, and these shafts 29 are rotatably fastened to the side plates 25. A Y-direction oscillating plate 30 is fastened by screws 31 to the X-direction sliding plates 27. The sliding surfaces of the Y-direction guide plates 26 and X-direction sliding plates 27 are formed in circular arcs centered on the tip of the tool 10.

Accordingly, by loosening the screws 31 and turning the eccentric shafts 29, it is possible to adjust the mechanism so that the X-direction sliding plates 27 can slide smoothly along the Y-direction guide plates 26. After this adjustment, the screws 31 are tightened.

A U-shaped groove 30a is formed in the Y-direction oscillating plate 30, and a bridge member is inserted in this U-shaped groove 30a. The screw portion of a micrometer 33 used for Y-direction adjustment (which is fastened to the vertically moving plate 13) is screwed into the bridge member 32.

A side plate 34 is fastened to one side surface of the vertically moving plate 13. A spring 35 is installed between the side plate 34 and the Y-direction oscillating plate 30 so that the Y-direction oscillating plate 30 is driven toward the micrometer 33 used for Y-direction adjustment. In addition, a Y-direction locking screw 36 is screwed into the side plate 34. The tip end of this Y-direction locking screw 36 presses against the side surface of the Y-direction oscillating plate 30.

(c) X-Direction Adjustment Mechanism (See FIGS. 1, 5, 7, 8, and 10).

An X-direction guide plate 40 is fastened to the upper portion of the front surface of the Y-direction oscillating plate 30, and an X-direction sliding plate 41 is installed on the undersurface of the X-direction guide plate 40. This X-direction sliding plate 41 is supported by rollers 42, and these rollers 42 are rotatably supported on eccentric shafts 43. These eccentric shafts 43 are rotatably fastened to the Y-direction oscillating plate 30.

An X-direction oscillating plate 44 is fastened by screws 45 to the X-direction guide plate 40, and X-direction sliding plate 41 is formed as circular arcs centered on the tip of the tool 10. Accordingly, by loosening the screws 45 and turning the eccentric shafts 43, it is possible to adjust the mechanism so that the X-direction sliding plate 41 can slide smoothly along the X-direction guide plate 40. After this adjustment, the screws 45 are tightened.

In addition, pins 46 with flanges are fastened to the lower end of the X-direction oscillating plate 44 so that the X-direction oscillating plate 44 is supported by these pins 46. Pin holes formed in the X-direction oscillating plate 44 are formed so that the X-direction oscillating plate 44 can oscillate about the undersurface of the tool 10.

Furthermore, a U-shaped groove 44a is formed in the X-direction oscillating plate 44, and a bridge member 50 is inserted in this U-shaped groove 44a. The screw portion of a micrometer 51 used for X direction adjustment (which is fastened to the side of the Y-direction oscillating plate 30) is screwed into the bridge member 50. Moreover, a spring 52 is installed between the side plate 34 and the X-direction oscillating plate 44 so that the X-direction oscillating plate 44 is driven toward the micrometer 51 used for X direction adjustment. An X-direction locking screw 53 is screwed into the X-direction oscillating plate 44, and the tip of this X-direction locking screw 53 presses against the front surface of the Y-direction oscillating plate 30.

(d) θ-Direction Adjustment Mechanism (See FIGS. 1, 5, 7, and 11).

A tool attachment block 60 is fixed to the lower front surface of the X-direction oscillating plate 44, and a supporting plate 61 is fixed to the central front surface of this tool attachment block 60. A tool holder 62 is attached to the lower inside surface of the supporting plate 61, and the tool 10 is fastened to this tool holder 62 by a screw 63. Grooves 60b are formed in the tool attachment block 60 on both sides so that the portion of the tool attachment block 60 to which the supporting plate 61 is fastened can bend slightly upward and downward relative to the fixed portion 60a of the tool attachment block 60.

A tool holder 64 used for θ-direction adjustment is installed inside the tool attachment block 60 and tool holder 62 so that the tool holder 64 is free to rotate with respect to the tool attachment block 60 and tool holder 62. The tool 10 is fastened to the tool holder 64 used for θ-direction adjustment by a screw 65 which is screwed into the tool holder 64 used for θ-direction adjustment. A groove 64a is formed in the tool holder 64 used for θ-direction adjustment.

An eccentric shaft 66 used for θ-direction adjustment (which is supported so that it is free to rotate on the supporting plate 61) is inserted into the groove 64a of the tool holder 64 used or θ-direction adjustment, and a θ-direction adjustment lever 67 is fastened to the eccentric shaft 66 used for θ-direction adjustment. A scale plate 68 which indicates the amount of rotation of the θ-direction adjustment lever 67 is fastened to the supporting plate 61.

(e) Other Mechanisms (See FIGS. 1 and 5).

A load converter 70, which converts any change in the load into a voltage and outputs the voltage, is fixed to the surface of the tool holder 64 used for θ-direction adjustment. A load setting screw 71 screwed into the X-direction oscillating plate 44 contacts the upper surface of the load converter 70.

Accordingly, the apparatus as a whole is lowered by the action of the vertical driving mechanism described above in (a) and the tool 10 is also lowered, thus causing the tool 10 to press against an article to be bonded. As a result, the tool-holding part of the tool attachment block 60 bends due to the action of the grooves 60b formed in the tool attachment block 60. In this way, stress is applied to the load converter 70, and an electrical signal is generated. The lowering of the tool 10 is stopped by this electrical signal. In other words, the bonding load can be freely set by the use of the load setting screw 71.

Operation of the above embodiment will be described below.

The θ-direction adjustment operation will be first described.

When the screw 63 is loosened and the θ-direction adjustment lever 67 is rotated, the side surface of the groove 64a in the tool holder 64 used for θ direction adjustment is pushed by the eccentric shaft 66 used for θ-direction adjustment. Thus, the tool holder 64 used for θ-direction adjustment rotates about the axial center of the tool 10. Accordingly, if the rotational amount of the θ-direction adjustment lever 67 (i.e. the relationship between the scale on the scale plate 68 and the angle of rotation of the tool 10 in the θ-direction) is determined in advance, an adjustment can easily be made by rotating the θ-direction adjustment lever 67 by an amount (as read on the scale of the scale plate 68) corresponding to the amount of the discrepancy. After this adjustment, the screw 63 is tightened so that the tool 10 is fastened to the tool holder 62.

As describe above, θ-direction adjustment can easily be accomplished by merely rotating the θ-direction adjustment lever 67. Accordingly, such adjustments can be made quickly and with high precision.

Adjustment in the XY direction will be described below.

When the X-direction locking screw 53 is loosened and the micrometer 51 used for X-direction adjustment is turned, the bridge member 50 moves forward and backward. Since the bridge member 50 is inserted in the U-shaped groove 44a of the X-direction oscillating plate 44, and since the X-direction sliding plate 41 is fixed to the X-direction oscillating plate 44, the forward and backward motion of the bridge member 50 (described above) causes the X-direction sliding plate 41 to rotate along the X-direction guide plate 40. In other words, the X-direction sliding plate 41 is rotated in the direction indicated by the arrows marked "A". More specifically, since the X-direction oscillating plate 44 rotates in the arrow A direction, the inclination of the undersurface of the tool 10 in the X direction is corrected. After this X-direction inclination is corrected, the X-direction locking screw 53 is tightened so that the X-direction oscillating plate 44 is fastened to the Y-direction oscillating plate 30.

After the X-direction locking screw 53 is tightened so that the X-direction oscillating plate 44 is fastened to the Y-direction oscillating plate 30, if the Y-direction locking screw 36 is loosened and the micrometer 33 used for Y-direction adjustment is turned, the bridge member 32 can move forward and backward. Since the bridge member 32 is inserted in the U-shaped groove 30a of the Y-direction oscillating plate 30, and since the X-direction sliding plate 27 is fastened to the Y-direction oscillating plate 30, the forward and backward motion of the bridge member 32 (described above) causes the X-direction sliding plate 27 to rotate along the Y-direction guide plate 26 as indicated by the arrows marked "B". More specifically, since the X-direction oscillating plate 44 rotates along with the Y-direction oscillating plate 30 in the arrow "B" direction, the inclination of the undersurface of the tool 10 in the Y direction is corrected. After this correction of the Y-direction inclination, the Y-direction locking screw 36 is tightened so that the Y-direction oscillating plate 30 is fastened to the vertically moving plate 13.

Accordingly, if the respective amounts of inclination of the tool 10 in the X and Y directions are known from a previous determination of the relationship between (a) the scales of the micrometer 51 and micrometer 33 and (b) the respective inclination amounts of the tool 10 in the X and Y directions, adjustments can easily be made by rotating the micrometers 51 and 33 the distance which read on the scales of these micrometers 51 and 33 and correspond to the respective discrepancies.

Thus, the inclinations in the X and directions can be adjusted merely by rotating the micrometer 51 used for X direction adjustment and the micrometer 33 used for Y direction adjustment. Accordingly, adjustments can be performed quickly and with a high degree of precision. Furthermore, since the tool 10 is rotated about its own tip, the position of the tip of the tool 10 does not change.

As is clear from the above description, according to the present invention, the position of the tool in the θ-direction can be finely adjusted. Accordingly, such adjustments can be made quickly and with a high degree of precision. In addition, adjustments in the X and Y directions can be made merely by rotating the X- and Y-direction adjustment means. Accordingly, the inclination of the tool can be adjusted quickly and with a high degree of precision. In this case, by rotating the X-direction oscillating plate and Y-direction oscillating plate about the tip of the tool, the position of the tool tip does not change.

I claim:

1. A tool holding mechanism for use in a bonder for semiconductor manufacturing, said mechanism comprising (a) a vertically moving member which is caused to reciprocate in a vertical direction, (b) a first direction oscillating plate installed on said vertically moving member so that said first direction oscillating plate is free to rotate relative to said vertical moving member and then secured to said vertically moving member, (c) a second direction oscillating plate installed on said first direction oscillating plate so that the second direction oscillating plate is free to rotate in a direction perpendicular to a rotational direction of said first direction oscillating plate and then secured to said first direction oscillating plate, said first and second directions being perpendicular to each other and defining a plane to which said vertical direction is perpendicular, (d) a first direction adjustment means which rotates said first direction oscillating plate, (e) a second direction adjustment means which rotates said second direction oscillating plate, (f) a tool attachment block mounted to said second direction oscillating plate, (g) a $\theta$-direction adjustment holder which is rotatably held by said tool attachment block and to which a tool is attached, and (h) an $\theta$-direction adjustment means which is installed on said tool attachment block and finely rotates said $\theta$-direction adjustment holder about an axial center of said tool.

* * * * *